United States Patent
Gu et al.

(10) Patent No.: US 10,446,483 B2
(45) Date of Patent: Oct. 15, 2019

(54) METAL-INSULATOR-METAL CAPACITORS WITH ENLARGED CONTACT AREAS

(71) Applicant: GLOBALFOUNDRIES Inc., Grand Cayman (KY)

(72) Inventors: Sipeng Gu, Clifton Park, NY (US); Jianwei Peng, Latham, NY (US); Xusheng Wu, Ballston Lake, NY (US); Yi Qi, Niskayuna, NY (US); Jeffrey Chee, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 3 days.

(21) Appl. No.: 15/872,589

(22) Filed: Jan. 16, 2018

(65) Prior Publication Data
US 2019/0221515 A1    Jul. 18, 2019

(51) Int. Cl.
*H01L 23/522* (2006.01)
*H01L 49/02* (2006.01)
*H01L 21/768* (2006.01)

(52) U.S. Cl.
CPC .... *H01L 23/5223* (2013.01); *H01L 21/76802* (2013.01); *H01L 21/76877* (2013.01); *H01L 23/5226* (2013.01); *H01L 28/60* (2013.01)

(58) Field of Classification Search
CPC ......... H01L 28/40; H01L 28/60; H01L 28/86; H01L 23/5223; H01L 23/5226
See application file for complete search history.

(56) References Cited

U.S. PATENT DOCUMENTS

| | | | | |
|---|---|---|---|---|
| 10,090,287 | B1* | 10/2018 | Adusumilli | H01L 29/66181 |
| 10,211,147 | B2* | 2/2019 | Zhang | H01L 23/5223 |
| 10,266,390 | B2* | 4/2019 | Tsai | G01P 15/0802 |
| 2002/0159316 | A1* | 10/2002 | Weinrich | H01L 21/76895 |
| | | | | 365/200 |
| 2004/0140527 | A1* | 7/2004 | Furuya | H01L 27/0805 |
| | | | | 257/532 |
| 2008/0054329 | A1* | 3/2008 | Kim | H01L 28/60 |
| | | | | 257/532 |
| 2010/0224960 | A1* | 9/2010 | Fischer | H01L 23/5223 |
| | | | | 257/532 |
| 2012/0199946 | A1* | 8/2012 | Kageyama | H01L 28/60 |
| | | | | 257/532 |
| 2013/0277770 | A1* | 10/2013 | Tsai | G01P 15/0802 |
| | | | | 257/415 |
| 2014/0042590 | A1* | 2/2014 | Chen | H01L 28/60 |
| | | | | 257/532 |
| 2014/0159200 | A1* | 6/2014 | Loke | H01L 23/5223 |
| | | | | 257/532 |

(Continued)

*Primary Examiner* — Victoria K. Hall
(74) *Attorney, Agent, or Firm* — Thompson Hine LLP; Anthony Canale

(57) ABSTRACT

Structures that include a metal-insulator-metal (MIM) capacitor and methods for fabricating a structure that includes a MIM capacitor. The MIM capacitor includes a first electrode, a second electrode, and a third electrode. A conductive via is arranged in a via opening extending in a vertical direction through at least the first electrode. The first electrode has a surface arranged inside the via opening in a plane transverse to the vertical direction, and the conductive via contacts the first electrode over an area of the surface.

20 Claims, 3 Drawing Sheets

(56) References Cited

U.S. PATENT DOCUMENTS

| | | | |
|---|---|---|---|
| 2015/0294936 A1* | 10/2015 | Shen | H01L 23/5223 |
| | | | 257/532 |
| 2016/0064472 A1 | 3/2016 | Cheng et al. | |
| 2018/0033559 A1* | 2/2018 | Jang | H01G 4/012 |
| 2019/0131385 A1* | 5/2019 | Huang | H01L 28/60 |
| 2019/0148072 A1* | 5/2019 | Fox | H01G 4/30 |

* cited by examiner

METAL-INSULATOR-METAL CAPACITORS WITH ENLARGED CONTACT AREAS

BACKGROUND

The invention relates generally to semiconductor device fabrication and, in particular, to structures that include a metal-insulator-metal (MIM) capacitor and methods for fabricating a structure that includes a MIM capacitor.

On-chip passive elements, such as MIM capacitors, are deployed in many types of integrated circuits, such as radiofrequency integrated circuits. A MIM capacitor may be integrated into one or more of the metallization levels of a back-end-of-line (BEOL) interconnect structure using materials that are commonly available in copper BEOL technologies. A two-electrode MIM capacitor includes top and bottom conductive plates, which operate as electrodes, and a capacitor dielectric disposed between the top and bottom conductive plates as an electrical insulator. The capacitance, or amount of charge held by the MIM capacitor per unit of applied voltage, depends among other factors on the area of the top and bottom conductive plates, their separation, and the dielectric constant of the material constituting the capacitor dielectric.

Improved structures that include a MIM capacitor and methods for fabricating a structure that includes a MIM capacitor are needed.

SUMMARY

In an embodiment of the invention, a structure includes a metal-insulator-metal (MIM) capacitor with a first electrode, a second electrode, and a third electrode, as well as a conductive via in a via opening extending in a vertical direction through at least the first electrode. The first electrode has a surface arranged inside the via opening in a plane transverse to the vertical direction, and the conductive via contacts the first electrode over an area of the surface.

In an embodiment of the invention, a method includes forming a metal-insulator-metal (MIM) capacitor that includes a first electrode, a second electrode, and a third electrode, forming a via opening extending in a vertical direction through the first electrode, and etching a dielectric layer relative to the first electrode with an isotropic etching process to expose a surface on the first electrode inside the via opening. The surface is arranged in a plane transverse to the vertical direction. The method further includes forming a conductive via in the via opening that contacts the first electrode over an area of the surface.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 3A is a top view of the device structure in which FIG. 3 is taken generally along line 3-3.

DETAILED DESCRIPTION

Figure 1:
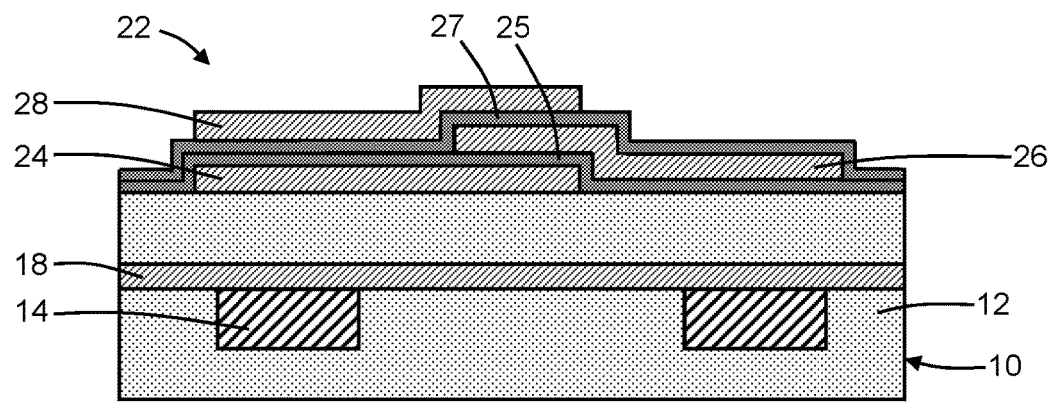
FIGS. 1-4 are cross-sectional views of a device structure at successive fabrication stages of a processing method in accordance with embodiments of the invention.

With reference to FIG. 1 and in accordance with embodiments of the invention, a back-end-of-line (BEOL) interconnect structure includes a dielectric layer 12 constituting an interlayer dielectric (ILD) of a metallization level 10, conductive wiring features 14 embedded in the dielectric layer 12, a capping layer 18 over the dielectric layer 12, and an interlayer dielectric layer 20 over the capping layer 18. Additional metallization levels (not shown) may be arranged below the metallization level 10. The dielectric layer 12 and the interlayer dielectric layer 20 may be comprised of an electrical insulator, such as an oxide-based dielectric material like silicon dioxide ($SiO_2$) a low-k dielectric material, or an ultra-low-k (ULK) dielectric material. The capping layer 18 may be comprised of a nitride-based dielectric material, such as silicon nitride ($Si_3N_4$). The conductive wiring features 14 of the metallization level 10 may be comprised of a metal such as copper, aluminum, or an alloy of these metals. The BEOL interconnect structure, including the metallization level 10, is carried on a die or chip (not shown) that has been processed by front-end-of-line (FEOL) processes, such as a complementary metal-oxide-semiconductor (CMOS) process, to fabricate one or more integrated circuits that contain device structures.

A metal-insulator-metal (MIM) capacitor, generally indicated by reference numeral 22, includes a bottom electrode 24, a middle electrode 26, and a top electrode 28, as well as a capacitor dielectric layer 25 and a capacitor dielectric layer 27. The capacitor dielectric layers 25, 27 function to electrically insulate the electrodes 24, 26, 28 from each other. The electrodes 24, 26, and 28 may be comprised of one or more conductive materials (i.e., conductors), such as titanium nitride (TiN), tantalum nitride (TaN), tantalum (Ta), titanium (Ti), tungsten (W), tungsten nitride (WN), a layered stack of the conductive materials (e.g., a bilayer of Ti and TiN), or a combination of these conductive materials. The capacitor dielectric layers 25, 27 may be comprised of one or more dielectric materials, such as a high-k dielectric material having a dielectric constant (i.e., permittivity) greater than the dielectric constant of $SiO_2$. Suitable high-k dielectric materials for the capacitor dielectric layers 25, 27 include, but are not limited to, a hafnium-based dielectric material like hafnium oxide ($HfO_2$), or a layered stack including of a hafnium-based dielectric material and another dielectric material (e.g., aluminum oxide ($Al_2O_3$)). The dielectric material(s) constituting the capacitor dielectric layers 25, 27 are removable selective to the conductor(s) constituting the electrodes 24, 26, 28. As used herein, the term "selective" in reference to a material removal process (e.g., etching) denotes that, with an appropriate etchant choice, the material removal rate (e.g., etch rate) for the targeted material is greater than the removal rate for at least another material exposed to the material removal process.

The bottom electrode 24 is formed by depositing a layer of its constituent conductor on the interlayer dielectric layer 20 and patterning the deposited layer to define its shape and location. The capacitor dielectric layer 25 is then conformally deposited over the bottom electrode 24 and the area on the top surface of the dielectric layer 20 that is not covered by the bottom electrode 24. The middle electrode 26 is formed by depositing a layer of its constituent conductor and patterning the deposited layer to define its shape and location relative to the bottom electrode 24. The middle electrode 26 has a section arranged to overlap with the bottom electrode 24 and a section that is offset from the bottom electrode 24. The capacitor dielectric layer 27 is then conformally deposited over the bottom electrode 24, the capacitor dielectric layer 25, and the middle electrode 26. The top electrode 28 is formed by depositing a layer of its constituent conductor and patterning the deposited layer to define its shape and location relative to the bottom electrode 24 and middle electrode 26. The top electrode 28 has a section that overlaps with only the bottom electrode 24 and another section that overlaps with stacked sections of the bottom electrode 24 and the middle electrode 26.

Each of the conductor layers may be deposited by, for example, physical vapor deposition (PVD) or chemical vapor deposition (CVD), and each of the capacitor dielectric layers 25, 27 may be conformally deposited by, for example, atomic layer deposition (ALD). Each layer patterning may involve the application of an etch mask covering a targeted area of the deposited conductor layer that is intended for each of the electrodes 24, 26, 28 of the MIM capacitor 22 and removing unmasked areas of the deposited layer with an etching process, such as reactive ion etching (RIE). The etching processes may stop on the dielectric material of the interlayer dielectric layer 20 when patterning the bottom electrode 24, on the dielectric material of the capacitor dielectric layer 25 when patterning the middle electrode 26, and on the dielectric material of the capacitor dielectric layer 27 when patterning the top electrode 28. After patterning of each of the electrodes 24, 26, 28 is completed, the associated etch mask may be removed by, for example, chemical stripping or a plasma ashing process.

Figure 2:
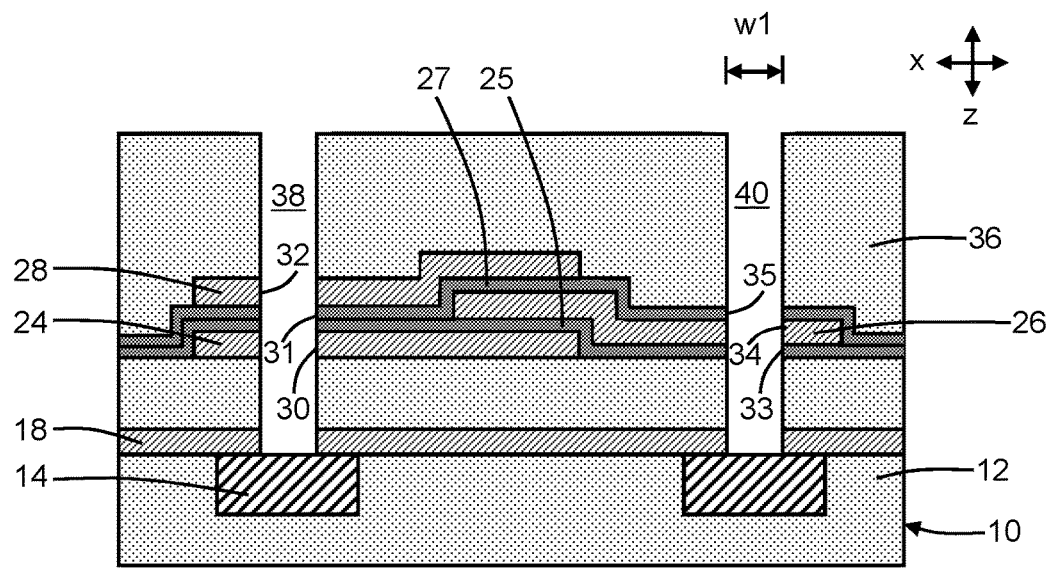

With reference to FIG. 2 in which like reference numerals refer to like features in FIG. 1 and at a subsequent fabrication stage, an interlayer dielectric layer 36 is formed over MIM capacitor 22 and is patterned with lithography and etching processes to form via openings 38, 40. In an embodiment, the interlayer dielectric layer 36 may be comprised of an electrical insulator, such as an oxide-based dielectric material like silicon dioxide (SiO$_2$) a low-k dielectric material, or an ultra-low-k (ULK) dielectric material. A patterned resist layer (not shown) may be applied over interlayer dielectric layer 36 and used to concurrently pattern the via openings 38, 40 with an etching process, such as reactive ion etching (ME), that may be conducted in multiple etching steps with different etch chemistries. The capping layer 18 may serve as an etch stop for the etching process forming the via openings 38, 40. The via openings 38, 40 extend in a vertical direction that is parallel to the z-axis and horizontal to a horizontal x-y plane that is arranged transverse to the vertical direction. Each of the via openings 38, 40 has a width, w1, in the x-y plane.

The via opening 38 extends in the vertical direction through the respective thicknesses of the interlayer dielectric layer 36, the top electrode 28, the capacitor dielectric layers 25, 27, the bottom electrode 24, the interlayer dielectric layer 20, and the capping layer 18 to one of the conductive wiring features 14 in the metallization level 10. An inner edge surface 30 of the bottom electrode 24, an inner edge surface 31 common to the capacitor dielectric layers 25, 27, and an inner edge surface 32 of the top electrode 28 extend about portions of the via opening 38. The via opening 38 is used, as discussed hereinbelow, to directly contact the top electrode 28 and the bottom electrode 24 of the MIM capacitor 22.

The via opening 40 extends in the vertical direction through the respective thicknesses of the interlayer dielectric layer 36, the capacitor dielectric layer 27, the middle electrode 26, the capacitor dielectric layer 25, the interlayer dielectric layer 20, and the capping layer 18 to another of the conductive wiring features 14 in the metallization level 10. An inner edge surface 34 of the middle electrode 26, an inner edge surface 33 of the capacitor dielectric layer 25, and an inner edge surface 35 of the capacitor dielectric layer 27 extend about portions of the via opening 40. The via opening 40 is used, as discussed hereinbelow, to directly contact the middle electrode 26 of the MIM capacitor 22.

Figure 3:
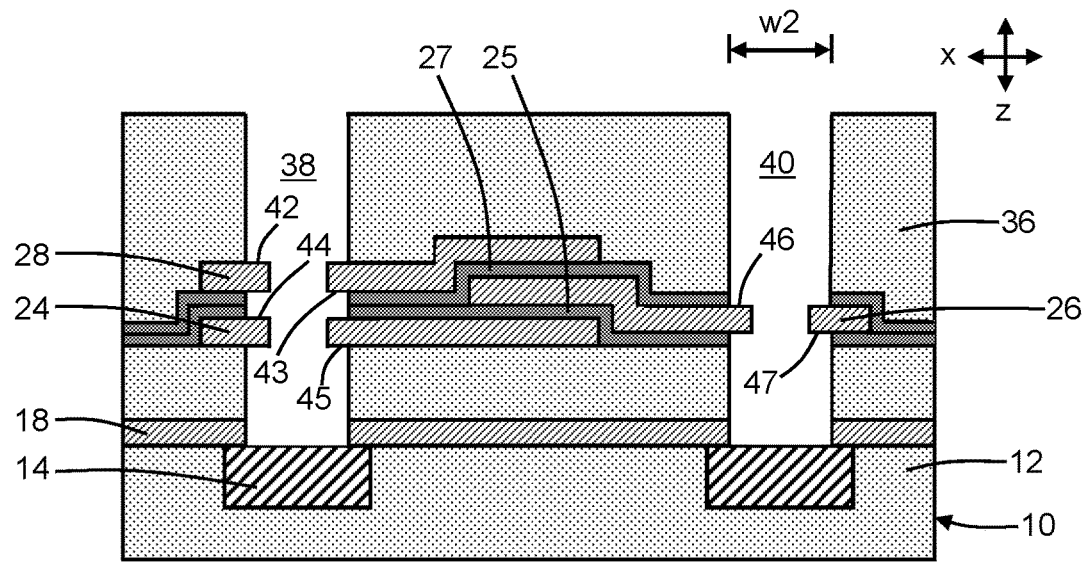
Figure 3A:
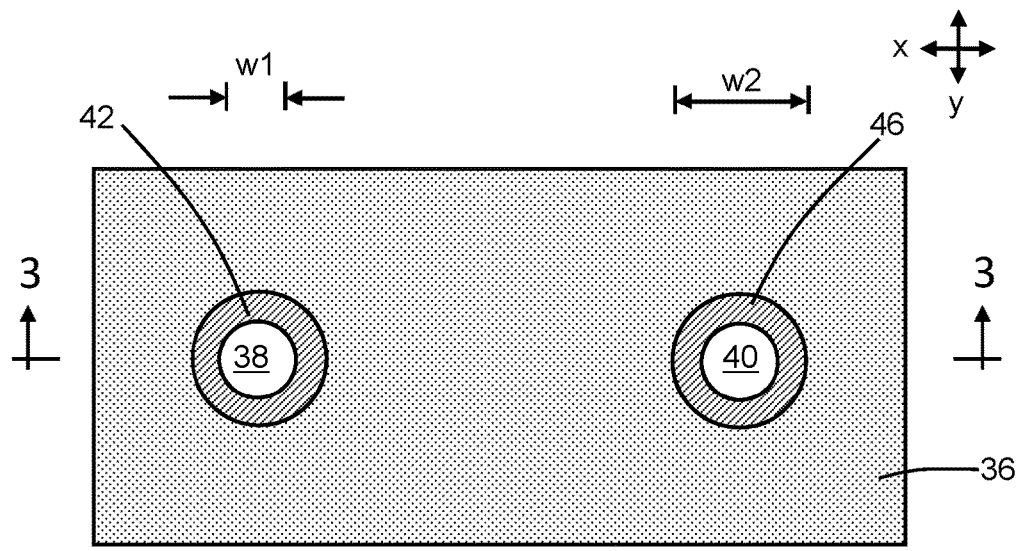

With reference to FIGS. 3, 3A in which like reference numerals refer to like features in FIG. 2 and at a subsequent fabrication stage, the capacitor dielectric layers 25, 27 and the interlayer dielectric layer 20, 36 are etched selective to the electrodes 24, 26, 28 using one or more isotropic etching processes. Portions of the via openings 38, 40 extending through the capacitor dielectric layers 25, 27 and portions of the via openings 38, 40 extending through the interlayer dielectric layer 20, 36 are enlarged by the one or more isotropic etching processes to have a width, w2, that is greater than their original width, w1. In an embodiment, a wet chemical etching process using a solution containing hydrofluoric (HF) acid may be used that removes silicon dioxide of the interlayer dielectric layers 20, 36 and hafnium oxide of the capacitor dielectric layers 25, 27 selective to titanium nitride of the electrodes 24, 26, 28. In embodiments, the pH of the HF-based solution may be tuned to be in a range from −1 to 0 or, alternatively, in a range from 2 to 4. The one or more isotropic etching processes may be timed to control the extent of the removal of the dielectric materials of the interlayer dielectric layers 20, 36 and the capacitor dielectric layers 25, 27.

A horizontal surface 42 on the top electrode 28 is exposed by the isotropic etching of the interlayer dielectric layer 36 inside the portion of the via opening 38 arranged above the MIM capacitor 22. The horizontal surface 42 is arranged at the intersection of the via opening 38 with the top electrode 28, and the material of the interlayer dielectric layer 36 circumscribes (i.e., surrounds or encircles) the horizontal surface 42. Another horizontal surface 45 on the bottom electrode 24 is exposed by the isotropic etching of the interlayer dielectric layer 20 inside the via opening 38 arranged below the MIM capacitor 22. The horizontal surface 45 is arranged at the intersection of the via opening 38 with the bottom electrode 24, and the material of the interlayer dielectric layer 20 circumscribes the horizontal surface 42.

The capacitor dielectric layers 25, 27 are laterally recessed relative to the top electrode 28 and the bottom electrode 24 over the portion of the via opening 38 extending through the MIM capacitor 22. In particular, the shared inner edge surface 31 of the capacitor dielectric layers 25, 27 is displaced outwardly by the one or more isotropic etching processes to locally widen this portion of the via opening 38 within the MIM capacitor 22 and between the top electrode 28 and the bottom electrode 24. The lateral recessing of the capacitor dielectric layers 25, 27 exposes a horizontal surface 43 on a bottom surface of the top electrode 28 and a horizontal surface 44 on a top surface of the bottom electrode 24 at the intersection of the via opening 38 with the capacitor dielectric layers 25, 27. The material of the capacitor dielectric layers 25, 27, in particular at the recessed shared interior edge surface 31, circumscribes the horizontal surfaces 43, 44.

Each of the horizontal surfaces 42-45 has a surface area that is arranged inside the inner boundary of a section of the via opening 38, and that is contained in the horizontal x-y plane. The inner edge surface 32 (FIG. 2) of the top electrode 28 connects the horizontal surface 42 with the horizontal surface 43. The inner edge surface 30 (FIG. 2) of the bottom electrode 24 connects the horizontal surface 44 with the horizontal surface 45. The shared inner edge surface 31 (FIG. 2) of the capacitor dielectric layers 25, 27 is oriented vertically between the horizontal surface 43 and the horizontal surface 44.

A horizontal surface 46 on the middle electrode 26 is exposed by the isotropic etching of the capacitor dielectric layer 27 and the interlayer dielectric layer 36 inside the portion of the via opening 40 arranged above the MIM capacitor 22. The material of the interlayer dielectric layer 36 and the material of the capacitor dielectric layer 27 each circumscribe the horizontal surface 46. Another horizontal surface 47 on the middle electrode 26 is exposed by the isotropic etching of the capacitor dielectric layer 25 and the interlayer dielectric layer 20 inside the portion of the via opening 40 arranged below the MIM capacitor 22. The material of the interlayer dielectric layer 20 and the material of the capacitor dielectric layer 25 each circumscribe the horizontal surface 46.

Each of the horizontal surfaces 46, 47 has a surface area that is arranged inside the inner boundary of a section of the via opening 40, and is contained in the horizontal x-y plane. The inner edge surface 34 (FIG. 3) of the middle electrode 26 connects the horizontal surface 46 with the horizontal surface 47. The inner edge surface 35 (FIG. 2) of the capacitor dielectric layer 27 is displaced laterally relative to the inner edge surface 34 with the horizontal surface 46 arranged therebetween. The inner edge surface 33 (FIG. 2) of the capacitor dielectric layer 25 is displaced laterally relative to the inner edge surface 34 with the horizontal surface 47 arranged therebetween.

Figure 4:
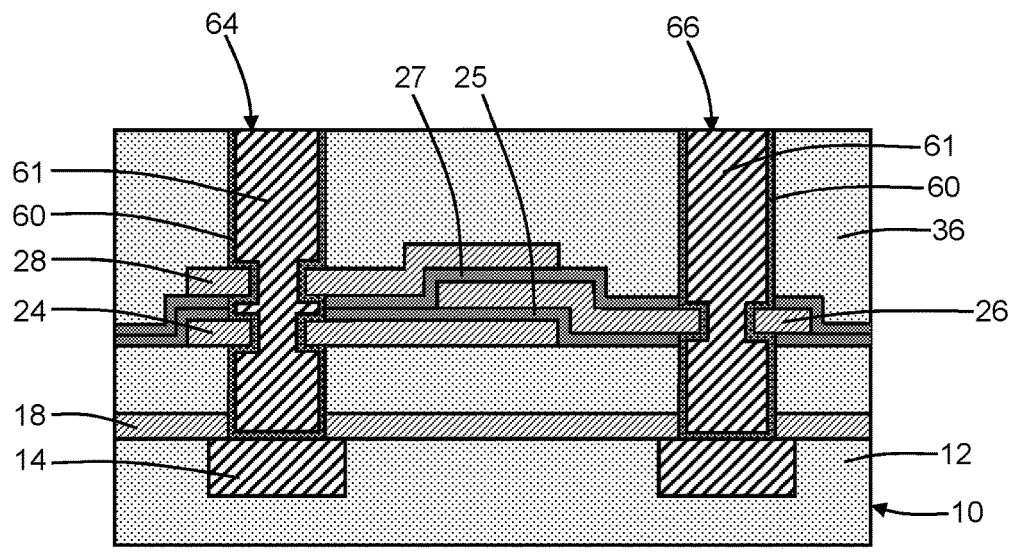

With reference to FIG. 4 in which like reference numerals refer to like features in FIG. 3 and at a subsequent fabrication stage, conductive vias 64, 66 are respectively formed inside the via openings 38, 40, and include sections of a liner layer 60 and a conductor layer 61. The surfaces surrounding the via openings 38, 40 may be coated with the liner layer 60 of a given conformal thickness. The liner layer 60 may be composed of one or more conductive materials (i.e., conductors), such as titanium nitride (TiN), tantalum nitride (TaN), tantalum (Ta), titanium (Ti), tungsten (W), tungsten nitride (WN), ruthenium (Ru), rhenium (Re), a layered stack of these conductive materials (e.g., a bilayer of Ti and TiN), or a combination of these conductive materials, deposited by, for example, atomic layer deposition (ALD). After the liner layer 60 is formed, the conductor layer 61 is formed inside the via openings 38, 40. The conductor layer 61 may be comprised of a metal, such as copper (Cu), cobalt (Co), ruthenium (Ru), or rhenium (Re), that may be deposited by electroless or electrolytic deposition, or another deposition technique. The respective materials of the liner layer 60 and the conductor layer 61 may also deposit in the field area on the top surface of the interlayer dielectric layer 36, and may be removed from the field area with a chemical mechanical polishing (CMP) process.

The conductive via 64 is electrically and physically connected with the top electrode 28 and the bottom electrode 24 of the MIM capacitor 22. In addition to the surface area of the inner edge surfaces 30, 32 (FIG. 2), the conductive via 64 contacts the top electrode 28 over the surface areas of the horizontal surfaces 44 and 45 (FIG. 3) on the bottom electrode 24 and over the surface areas of the horizontal surfaces 42 and 43 (FIG. 3) on the top electrode 28. The contact area across the horizontal surfaces 42, 43, 44, 45, in addition to the contact area across inner edge surfaces 30, 32, effectively increases the contact area of the conductive via 64 with the electrodes 24, 28 in comparison with conventional arrangements in which the inner edge surfaces of the top and bottom electrodes exclusively supply the contact area. The increased contact area may function to lower the contact resistance between the conductive via and the electrodes 24 and 28.

The conductive via 66 is electrically and physically connected with the middle electrode 26 of the MIM capacitor 22. In addition to the surface area of the inner edge surface 34 (FIG. 2), the conductive via 66 contacts the middle electrode 26 over the surface areas of the horizontal surfaces 46 and 47 (FIG. 3) on the middle electrode 26. The contact area across the horizontal surfaces 46, 47, in addition to the contact area across inner edge surfaces 34, effectively increases the contact area of the conductive via 66 with the middle electrode 26 in comparison with conventional arrangements in which only the inner edge surface of the middle electrode supplies the contact area. The increased contact area may function to lower the contact resistance between the conductive via 66 and the middle electrode 26.

The principles of the invention may be applicable to MIM capacitors including fewer electrodes than the MIM capacitor 22, or to MIM capacitors including more than three electrodes.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a metal-insulator-metal (MIM) capacitor including a first electrode, a second electrode, a third electrode, and a capacitor dielectric layer; and
a first conductive via in a first via opening extending in a vertical direction through the capacitor dielectric layer, the first electrode, and the second electrode,
wherein the first electrode has a first surface arranged inside the first via opening in a first plane transverse to the vertical direction, the first conductive via contacts the first electrode over an area of the first surface, and the first surface of the first electrode is between the first electrode and the second electrode.

2. The structure of claim 1 wherein the capacitor dielectric layer is arranged in the vertical direction between the first electrode and the second electrode, and the capacitor dielectric layer is arranged to circumscribe the first surface of the first electrode.

3. The structure of claim 2 wherein the second electrode has a second surface arranged in a second plane transverse to the vertical direction, the second surface is between the first electrode and the second electrode, the first conductive via contacts the second electrode over an area of the second surface, and the capacitor dielectric layer is arranged to circumscribe the second surface of the second electrode.

4. The structure of claim 1 further comprising:
a second conductive via in a second via opening extending vertically through the third electrode, the second via opening displaced laterally from the first via opening,
wherein the third electrode has a second surface arranged in a second plane transverse to the vertical direction, and the second conductive via contacts the third electrode over an area of the second surface.

5. A structure comprising:
a first interlayer dielectric layer,
a metal-insulator-metal (MIM) capacitor including a first electrode, a second electrode, a third electrode, and a capacitor dielectric layer; and
a first conductive via in a first via opening extending in a vertical direction through the capacitor dielectric layer and at least the first electrode,
wherein the first electrode has a first surface arranged inside the first via opening in a first plane transverse to the vertical direction, the first conductive via contacts the first electrode over an area of the first surface, the MIM capacitor is arranged in the vertical direction over the first interlayer dielectric layer, the first via opening is arranged in the first interlayer dielectric layer, and the first interlayer dielectric layer circumscribes the first surface of the first electrode.

6. The structure of claim 5 further comprising:
a second interlayer dielectric layer arranged in the vertical direction over the MIM capacitor,
wherein the first via opening extends in the vertical direction through the first interlayer dielectric layer, the first via opening extends in the vertical direction through the second interlayer dielectric layer, and the capacitor dielectric layer is arranged in the vertical direction between the first electrode and the second interlayer dielectric layer.

7. The structure of claim 6 further comprising:
a second conductive via in a second via opening extending vertically through the second interlayer dielectric layer and the second electrode, the second via opening displaced laterally from the first via opening,
wherein the second electrode has a second surface arranged in a second plane transverse to the vertical direction, and the second conductive via contacts the second electrode over an area of the second surface.

8. The structure of claim 7 wherein the second via opening extends through the capacitor dielectric layer, and the capacitor dielectric layer is arranged to circumscribe the second surface of the second electrode.

9. The structure of claim 6 wherein the first electrode has a second surface arranged in a second plane transverse to the vertical direction, and the first conductive via contacts the first electrode over an area of the second surface.

10. The structure of claim 9 wherein the capacitor dielectric layer is arranged in the vertical direction between the first electrode and the second interlayer dielectric layer, and the capacitor dielectric layer is arranged to circumscribe the second surface of the first electrode.

11. The structure of claim 5 wherein the capacitor dielectric layer is arranged in the vertical direction between the first electrode and the first interlayer dielectric layer, the first via opening extends through the capacitor dielectric layer, and the capacitor dielectric layer is arranged to circumscribe the first surface of the first electrode.

12. The structure of claim 11 further comprising:
a second conductive via in a second via opening extending vertically through the second electrode, the second via opening displaced laterally from the first via opening,
wherein the second electrode has a second surface arranged in a second plane transverse to the vertical direction, and the second conductive via contacts the second electrode over an area of the second surface.

13. A method comprising:
forming a metal-insulator-metal (MIM) capacitor including a first electrode, a second electrode, and a third electrode;
forming a first via opening extending in a vertical direction through the first electrode;
etching a dielectric layer relative to the first electrode with an isotropic etching process to expose a first surface on the first electrode inside the first via opening that is arranged in a first plane transverse to the vertical direction; and
forming a first conductive via in the first via opening that contacts the first electrode over an area of the first surface.

14. The method of claim 13 wherein the dielectric layer is arranged in the vertical direction between the first electrode and the second electrode, the first via opening extends in the vertical direction through the dielectric layer and the second electrode, the first surface of the first electrode is between the first electrode and the second electrode, and the dielectric layer is arranged to circumscribe the first surface of the first electrode.

15. The method of claim 14 wherein the second electrode has a second surface arranged inside the first via opening in a second plane transverse to the vertical direction, the second surface of the second electrode is between the first electrode and the second electrode, the first conductive via contacts an area of the second surface of the second electrode, and the dielectric layer is arranged to circumscribe the second surface of the second electrode.

16. The method of claim 13 further comprising:
forming a second via opening extending vertically through the third electrode, the second via opening displaced laterally from the first via opening; and forming a second conductive via in the second via opening, wherein the third electrode has a second surface arranged inside the second via opening in a second plane transverse to the vertical direction, and the second conductive via contacts the third electrode over the area of the second surface.

17. The method of claim 13 further comprising:

depositing an interlayer dielectric layer arranged in the vertical direction over the MIM capacitor, wherein the first via opening extends in the vertical direction through the interlayer dielectric layer, and the interlayer dielectric layer circumscribes the first surface of the first electrode.

18. The method of claim 17 wherein the MIM capacitor includes a capacitor dielectric layer arranged in the vertical direction between the first electrode and the interlayer dielectric layer, the first via opening extends through the capacitor dielectric layer, and the capacitor dielectric layer is arranged to circumscribe the first surface of the first electrode.

19. The method of claim 13 further comprising:

before forming the MIM capacitor, depositing an interlayer dielectric layer, wherein the MIM capacitor is arranged in the vertical direction over the interlayer dielectric layer, the first via opening is arranged in the interlayer dielectric layer, and the interlayer dielectric layer circumscribes the first surface of the first electrode.

20. The method of claim 19 wherein the MIM capacitor includes a capacitor dielectric layer arranged in the vertical direction between the first electrode and the interlayer dielectric layer, the first via opening extends through the capacitor dielectric layer, and the capacitor dielectric layer is arranged to circumscribe the first surface of the first electrode.

* * * * *